United States Patent
Wiant et al.

(10) Patent No.: US 10,700,503 B2
(45) Date of Patent: Jun. 30, 2020

(54) ELECTRICAL BUS BAR ASSEMBLIES, BUS BAR SUPPORT ASSEMBLIES, BUS BAR BRACE APPARATUS, YOKE BRACE APPARATUS, AND METHODS

(71) Applicant: Siemens Industry, Inc., Alpharetta, GA (US)

(72) Inventors: Jason P. Wiant, Bedford, TX (US); Sibi Mathew, Edgecliff Village, TX (US)

(73) Assignee: SIEMENS INDUSTRY, INC., Alpharetta, GA (US)

(*) Notice: Subject to any disclaimer, the term of this patent is extended or adjusted under 35 U.S.C. 154(b) by 93 days.

(21) Appl. No.: 15/962,119

(22) Filed: Apr. 25, 2018

(65) Prior Publication Data
US 2019/0334335 A1 Oct. 31, 2019

(51) Int. Cl.
*H02G 5/02* (2006.01)
*H01B 7/02* (2006.01)
*H05K 7/06* (2006.01)
*H02G 1/06* (2006.01)

(52) U.S. Cl.
CPC .............. *H02G 5/025* (2013.01); *H01B 7/02* (2013.01); *H02G 1/06* (2013.01); *H05K 7/06* (2013.01)

(58) Field of Classification Search
CPC ............ H02G 5/025; H02G 5/00; H02G 5/06; H02G 1/14; H02B 1/20; H02B 1/21; H02B 1/205; H02B 1/207; H02B 1/22; H02B 1/30; H02K 5/00; H02K 5/02; H05K 5/00; H05K 5/02; H05K 5/0069; H05K 7/00; H01B 1/026
See application file for complete search history.

(56) References Cited

U.S. PATENT DOCUMENTS

| | | | |
|---|---|---|---|
| 6,040,976 A | 3/2000 | Bruner et al. | |
| 6,111,745 A | 8/2000 | Wilkie et al. | |
| 6,169,248 B1 | 1/2001 | Rowe et al. | |
| 6,781,818 B2 * | 8/2004 | Josten | H02B 1/21 361/611 |
| 6,934,147 B2 * | 8/2005 | Miller | H02B 1/21 174/68.2 |
| 7,075,021 B2 | 7/2006 | Rowe et al. | |
| 8,289,680 B2 * | 10/2012 | Keegan | H05K 7/1457 361/611 |
| 8,437,118 B2 | 5/2013 | Kasza et al. | |

(Continued)

*Primary Examiner* — Timothy J Thompson
*Assistant Examiner* — Amol H Patel

(57) ABSTRACT

An electrical bus bar assembly configured to maintain spacing between run-over bus bars and horizontal bus bars. The electrical bus bar assembly having a first run-over bus bar and a second run-over bus bar spaced from the first run-over bus bar, and a first horizontal bus bar spaced from the first run-over bus bar. A yoke brace apparatus is coupled between and maintains a first spacing distance D1 between the first run-over bus bar and the second run-over bus bar, and one or more bus bar brace apparatus are provided to maintain a second spacing distance D2 between the first run-over bus bar and the first horizontal bus bar. Yoke brace apparatus and bus bar brace assemblies, bus bar assemblies including the yoke brace apparatus and/or bus bar brace apparatus, bus bar support assemblies, supported electrical bus bar assemblies, and methods of supporting electrical bus bars are disclosed, as are other aspects.

20 Claims, 10 Drawing Sheets

(56) References Cited

U.S. PATENT DOCUMENTS

| | | |
|---|---|---|
| 8,717,741 B2 | 5/2014 | Valenzuela |
| 9,006,571 B2 * | 4/2015 | Manhart ................. H02B 1/21 |
| | | 174/129 B |
| 9,144,161 B2 | 9/2015 | Kozuru et al. |
| 9,391,413 B2 * | 7/2016 | Blasbalg ................. H02B 1/21 |
| 9,622,374 B2 | 4/2017 | Bhattacharya et al. |
| 9,705,294 B2 | 7/2017 | Kubota et al. |
| 2017/0163021 A1 * | 6/2017 | Hamilton ............. H02G 3/0456 |

* cited by examiner

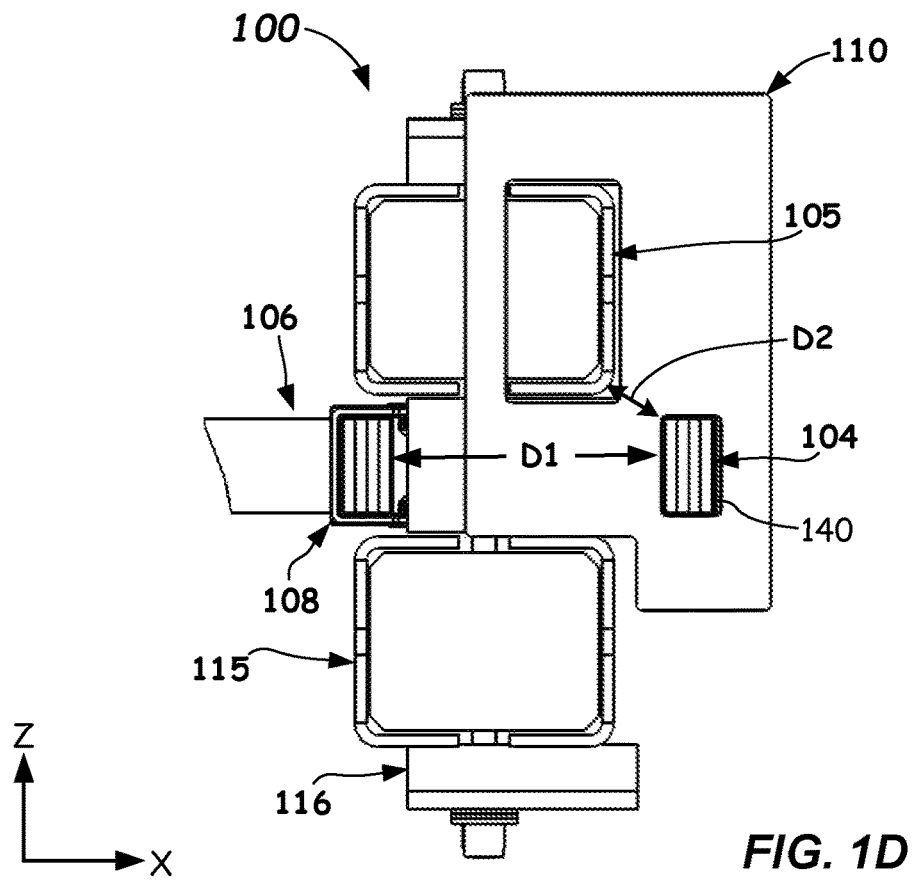
FIG. 1D
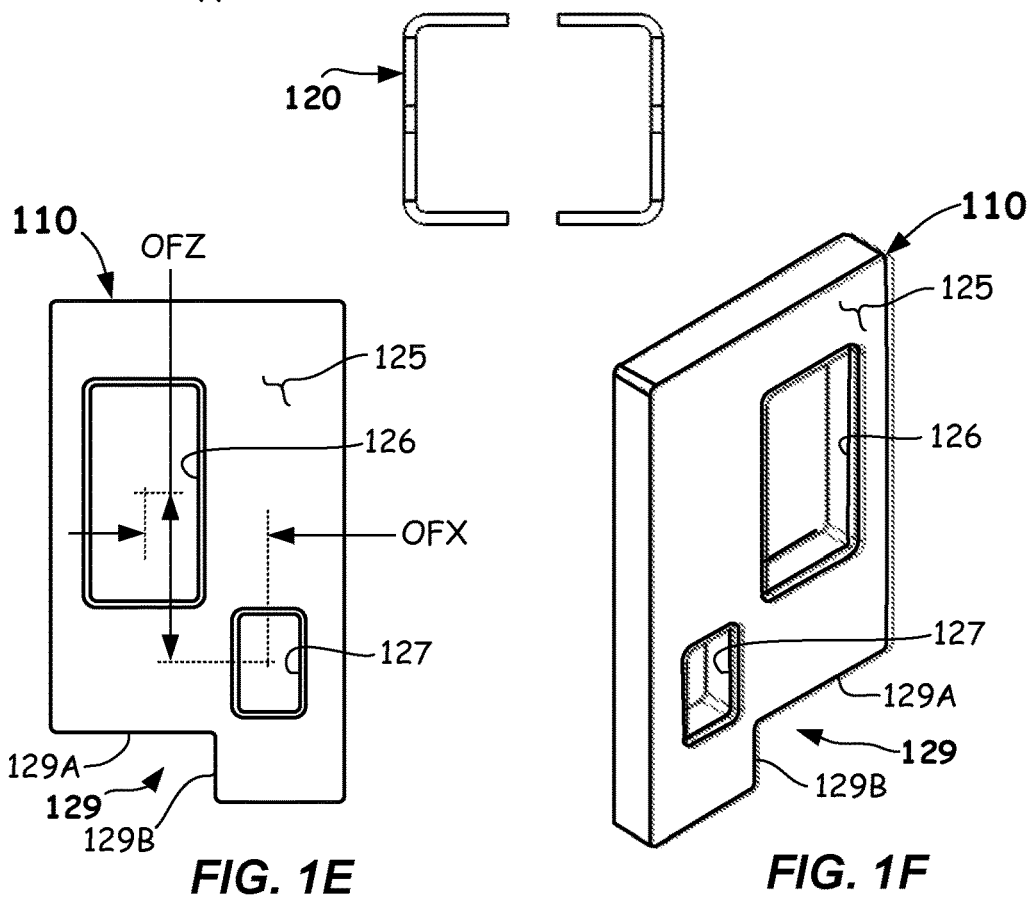
FIG. 1E
FIG. 1F

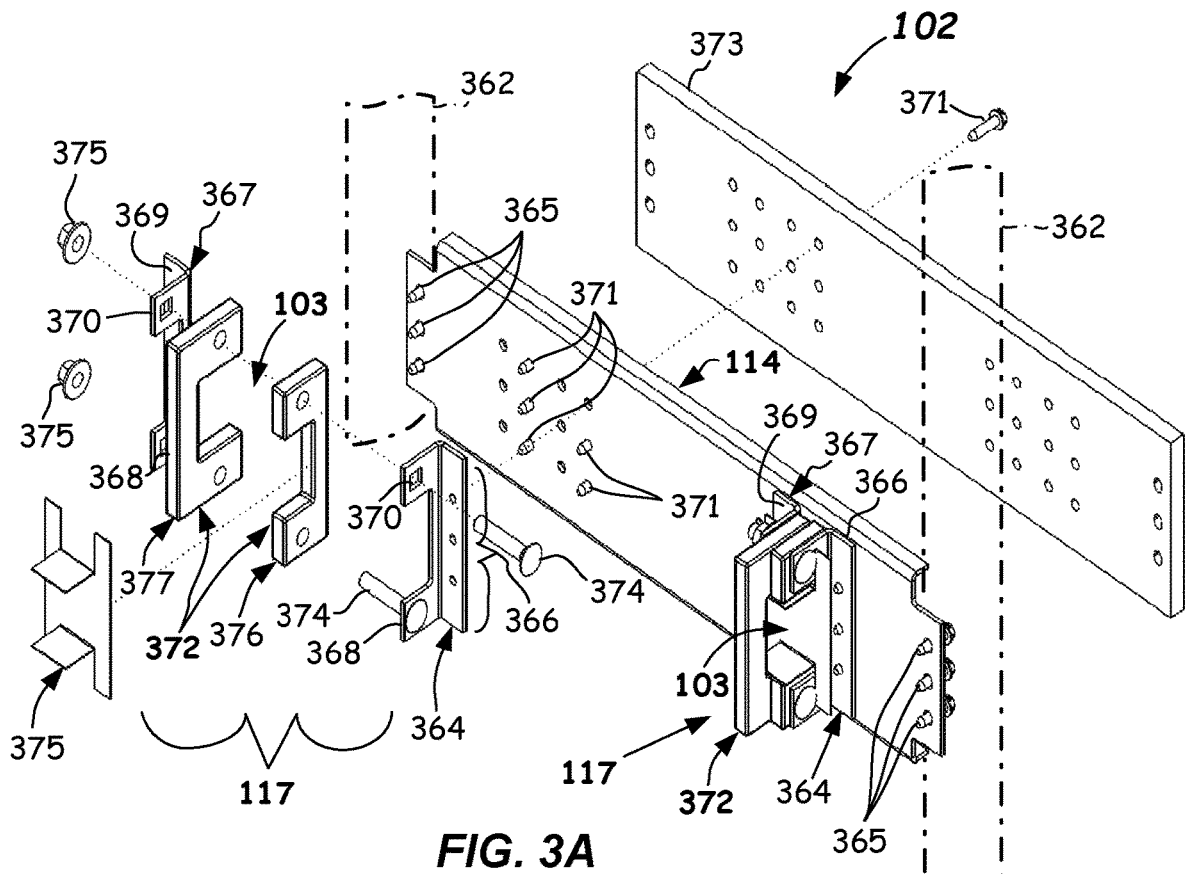
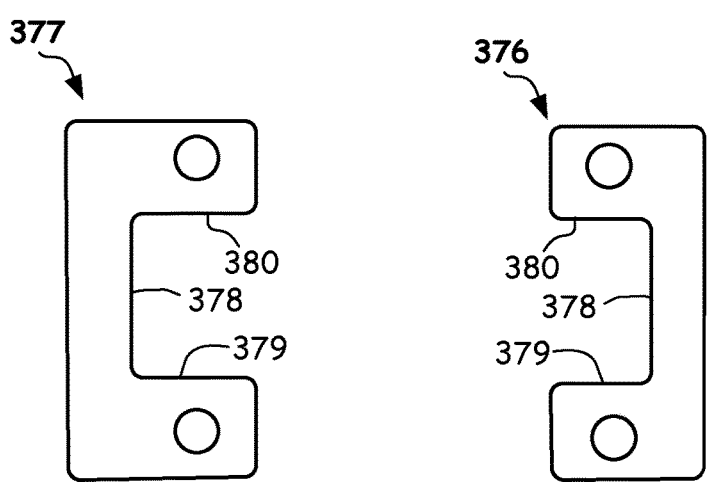
FIG. 3A
FIG. 3B
FIG. 3C

ELECTRICAL BUS BAR ASSEMBLIES, BUS BAR SUPPORT ASSEMBLIES, BUS BAR BRACE APPARATUS, YOKE BRACE APPARATUS, AND METHODS

FIELD

The present disclosure relates to apparatus, assemblies, and methods for electrical power distribution, and specifically to electrical bus bar assemblies including run-over buses.

BACKGROUND

In switchgear and switchboard systems, run-over buses, such as A-, B-, and C-phase run-over buses can connect between circuit breakers and terminal blocks. For example, in one implementation, run-over bus bars can connect between a load side of a circuit breaker and the terminal blocks that are configured to attach to load cables. Running near these run-over bus bars can be various other bus bars (e.g. horizontal bus bars) that carry A-, B-, and C-phase line current to a line side of the circuit breakers. The horizontal bus bars can be interconnected to three-phase line power, for example. Within such switchgear there may be multiple circuit breakers, each having A-, B-, and C-phase run-over bus bars, an A-, B-, and C-phase horizontal bus bar or other bus bars connected thereto.

In such switchgear, it is desired to move the components as close together as possible to minimize overall space envelope. Such close proximity of various bus bars, such as run-over bus bars and thru (horizontal) bus bars under normal operating conditions is not problematic. However, such close proximity during a short-circuit event can cause substantial forces and possible bending of various bus bar components. If such bending is sufficiently large, it could be possible to have a phase-to-phase short circuit and/or undesirable arcing. Forces encountered during such short-circuit events can be considerable and are approximately inversely proportional to the spacing between the various affected bus bars.

Thus, there is a need to improve various electrical bus bar assemblies to improve their strength and allow such close proximity positioning thereof.

SUMMARY

According to a first embodiment, an electrical bus bar assembly is provided. The electrical bus bar assembly includes a first run-over bus bar; a second run-over bus bar spaced a first distance from the first run-over bus bar; a first horizontal bus bar spaced from the first run-over bus bar; a yoke brace apparatus coupled between the first run-over bus bar and the second run-over bus bar; and one or more bus bar brace apparatus provided to maintain a second distance between the first run-over bus bar and the first horizontal bus bar.

According to a second embodiment, an electrical bus bar assembly is provided. The electrical bus assembly includes a first run-over electrical bus bar; a first horizontal bus bar spaced apart from the first run-over bus bar; and one or more bus bar brace apparatus provided to maintain a distance between the first run-over bus bar and the first horizontal bus bar, the bus bar brace apparatus, comprising: a body of insulating material, a first opening through the body receiving at least a portion of the first horizontal bus bar there through, and a second opening through the body receiving the first run-over bus bar there through.

According to another embodiment, a bus bar brace apparatus is provided. The bus bar brace apparatus includes a body of insulating material; a first opening through the body configured to receive at least a portion of a first horizontal bus bar; and a second opening through the body configured to receive a first run-over bus bar.

According to another embodiment, a yoke brace apparatus is provided. The yoke brace apparatus includes a yoke brace spacer including a first end and a second end, the yoke brace spacer is made of laminated construction comprising structural laminate components having a first rigidity and spacer laminate components having a second rigidity less than the first rigidity, and wherein the structural laminate components comprise more than one on each side of the yoke brace spacer; a first yoke bracket coupled to the yoke brace spacer on the first end, the first yoke bracket including a first channel configured to couple to a first electrical bus bar; and a second yoke bracket coupled to the yoke brace spacer on the second end opposite from the first end, the second yoke bracket including a second channel configured to couple to a second electrical bus bar, and wherein the yoke brace apparatus is configured to maintain a fixed spacing between the first channel and the second channel.

According to another embodiment, a bus bar support assembly is provided. The bus bar support assembly includes a support structure configured to couple to a structural component of a switchgear cabinet; a first mounting bracket including a first attachment portion coupled to the support structure; a second mounting bracket including a second attachment portion coupled to the support structure; and an insulating support assembly including a bus bar-receiving opening configured to fully encircle the electrical bus bar.

According to another embodiment, a supported electrical bus assembly is provided. The supported electrical bus assembly includes a first run-over bus bar; a bus bar support assembly, comprising: a support structure configured to couple to a structural component of a switchgear cabinet, a first mounting bracket including a first attachment portion coupled to the support structure, a second mounting bracket including a second attachment portion coupled to the support structure, and an insulating support assembly including a bus bar-receiving opening configured to fully encircle the first run-over bus bar; a second run-over bus bar spaced from the first run-over bus bar; a yoke brace apparatus coupled between the first run-over bus bar and the second run-over bus bar, the yoke brace apparatus, comprising: a yoke brace spacer including a first end and a second end, a first yoke bracket coupled to the yoke brace spacer on the first end, the first yoke bracket coupled to the first run-over bus, and a second yoke bracket coupled to the yoke brace spacer on the second end opposite from the first end, the second yoke bracket coupled to the second run-over bus.

According to another embodiment, a method of supporting electrical bus bars is provided. The method includes providing a first run-over bus bar; providing a second run-over bus bar spaced a first distance from the first run-over bus bar; providing a horizontal bus bar spaced a second distance from the first run-over bus bar; supporting and maintaining the first distance between the first run-over bus bar and the second run-over bus bar with a yoke brace apparatus; and supporting and maintaining the second distance between the first run-over bus bar and the horizontal bus bar with a bus bar brace apparatus.

According to another embodiment, a method of supporting electrical bus bars is provided. The method includes providing a first run-over bus bar; providing a second run-over bus bar spaced a first distance from the first run-over bus bar; providing a support structure configured to couple to a structural component of a switchgear cabinet; providing a first mounting bracket and a second mounting bracket each coupled to the support structure; supporting the first run-over bus bar with an insulating support assembly coupled to the first mounting bracket and the second mounting bracket, the insulating support assembly including a bus bar-receiving opening configured to fully encircle the first run-over bus bar; and supporting and maintaining the first distance between the first run-over bus bar and the second run-over bus bar with one or more yoke brace apparatus.

Still other aspects, features, and advantages of the present disclosure may be readily apparent from the following description by illustrating a number of example embodiments, including the best mode contemplated for carrying out the present disclosure. The present invention may also be capable of other and different embodiments, and its details may be modified in various respects, all without departing from the substance and scope of the present disclosure. The disclosure covers all modifications, equivalents, and alternatives falling within the substance and scope of the claims.

BRIEF DESCRIPTION OF DRAWINGS

The drawings, described below, are for illustrative purposes only and are not necessarily drawn to scale. The drawings are not intended to limit the scope of the invention in any way. Wherever possible, the same or like reference numerals will be used throughout the drawings to refer to the same or like parts.

FIG. 1D illustrates a partial side plan view of an electrical bus bar assembly according to embodiments.

FIG. 1E illustrates a side plan view of a bus bar brace apparatus according to embodiments.

FIG. 1F illustrates a perspective view of a bus bar brace apparatus according to embodiments.

FIG. 3A illustrates an exploded perspective view of a bus bar support assembly according to one or more embodiments.

FIG. 3B illustrates a front plan view of a first insulating support according to one or more embodiments.

FIG. 3C illustrates a front plan view of a second insulating support according to one or more embodiments.

DETAILED DESCRIPTION

Figure 1A:
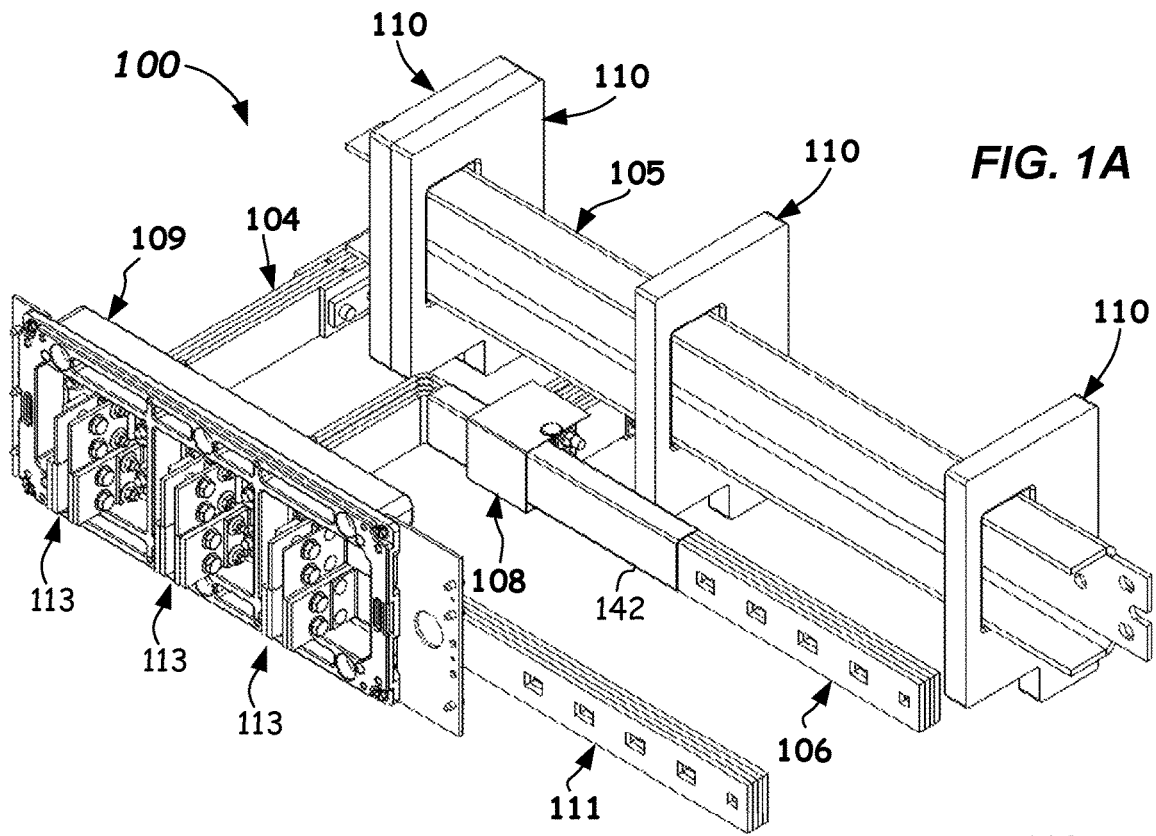
FIG. 1A illustrates a front perspective view of an electrical bus bar assembly according to embodiments.
Figure 1B:
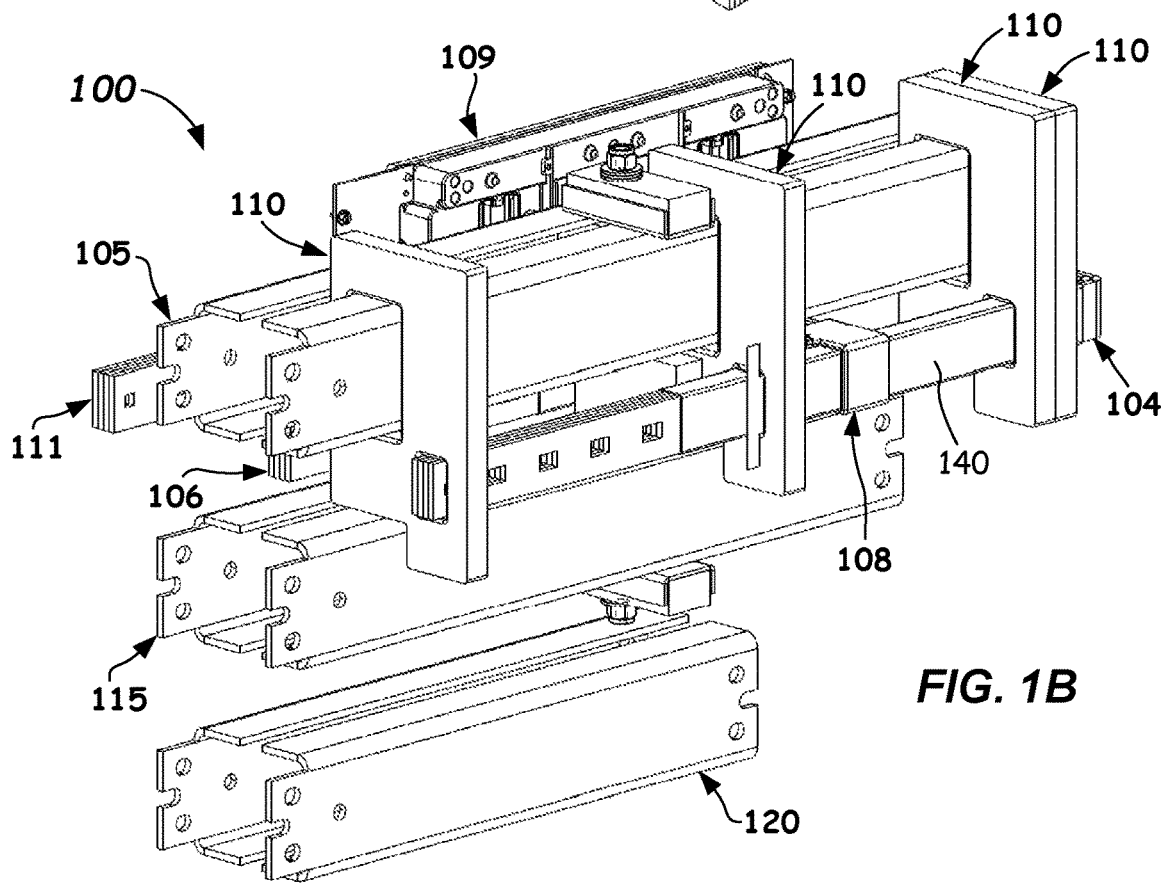
FIG. 1B illustrates a rear perspective view of an electrical bus bar assembly according to embodiments.

Reference will now be made in detail to the embodiments of this disclosure, examples of which are illustrated in the accompanying drawings. The aforementioned problems of prior art electrical bus bar assemblies can be overcome by one or more embodiments of the present disclosure. In particular, the use of the inventive electrical bus bar assemblies, bus bar brace apparatus, yoke brace apparatus, bus bar support assemblies, supported electrical bus bar assemblies, and methods of support electrical bus bars described herein can provide substantially rigid and adequately supported bus bar structures. As such, minimal absolute and relative motion of the various supported bus bars, such as run-over bus bars and/or horizontal bus bars, and the like can be provided when high current, short-circuit events are encountered. In particular, during such short circuits events, large attraction or repulsion forces may be present, such as between various phase run-over bus bars and/or between run-over bus bars and other bus bars such as horizontal bus bars.

In one embodiment, an electrical bus bar assembly is provided. The electrical bus bar assembly comprises a first run-over bus bar and a second run-over bus bar spaced a first distance D1 from the first run-over bus bar, and a first horizontal bus bar spaced a second distance from the first run-over bus bar, and that may be parallel thereto. A yoke brace apparatus coupled between the first run-over bus bar and the second run-over bus bar maintains the first distance D1, and one or more bus bar brace apparatus maintains the second distance D2 between the first run-over bus bar and the first horizontal bus bar.

In another broad aspect capable of independent use, an electrical bus bar assembly is provided. The electrical bus bar assembly includes a first run-over bus bar; a first horizontal bus bar spaced apart from the first run-over bus bar; and one or more bus bar brace apparatus provided to maintain a distance D2 between the first run-over bus bar and the first horizontal bus bar, the bus bar brace apparatus having a body of insulating material, a first opening receiving at least a portion of the first horizontal bus bar, and a second opening receiving at least a portion of the first run-over bus bar.

In yet another broad aspect capable of independent use, a bus bar brace apparatus is provided. The bus bar brace apparatus includes a body of insulating material, a first opening through the body configured to receive at least a portion of a first horizontal bus bar, and a second opening through the body configured to receive a first run-over bus bar. The bus bar brace apparatus can maintain a second spacing distance D2 between the first horizontal bus bar and the first run-over bus bar.

In another broad aspect capable of independent use, a yoke brace apparatus is provided. The yoke brace apparatus includes a yoke brace spacer made of laminated construction and comprising structural laminate components having a first rigidity and spacer laminate components having a second rigidity less than the first rigidity, and wherein the structural laminate components comprise more than one structural laminate component on each side of the yoke brace spacer. Yoke brace apparatus further includes a first yoke bracket coupled to the yoke brace spacer on a first end, the first yoke bracket including a first channel configured to couple to a first electrical bus bar, such as first run-over bus bar, and a second yoke bracket coupled to the yoke brace spacer on a second end, the second yoke bracket including a second channel configured to couple to a second electrical bus bar, such as a second run-over bus bar. The yoke brace apparatus is configured to maintain a fixed spacing distance between the first channel and the second channel, and thus a fixed spacing distance D1 between the first and second electrical bus bars.

In a further broad aspect capable of independent use, a bus bar support assembly is provided. The bus bar support assembly includes a support structure configured to couple to a structural component of a switchgear cabinet, such as a cabinet frame, a first mounting bracket including a first attachment portion coupled to the support structure, a second mounting bracket including a second attachment portion coupled to the support structure, and an insulating support assembly including a bus bar-receiving opening configured to fully encircle the electrical bus bar, such as a first run-over bus bar (e.g., an A-phase run-over bus bar).

Supported electrical bus assemblies and methods of supporting electrical bus bars are also provided.

One or more embodiments of the disclosure will now be explained in greater detail with reference to FIGS. 1A-6 herein. FIGS. 1A-1H illustrate one or more embodiments of electrical bus bar assemblies 100, 100A and subcomponents thereof, such as a yoke brace apparatus 108, bus bar brace apparatus 110, and an bus bar support assembly 102, that can be used within an electrical power distribution enclosure 400 (e.g., switchgear cabinet) as shown in FIG. 4, or in other suitable systems.

Figure 4:
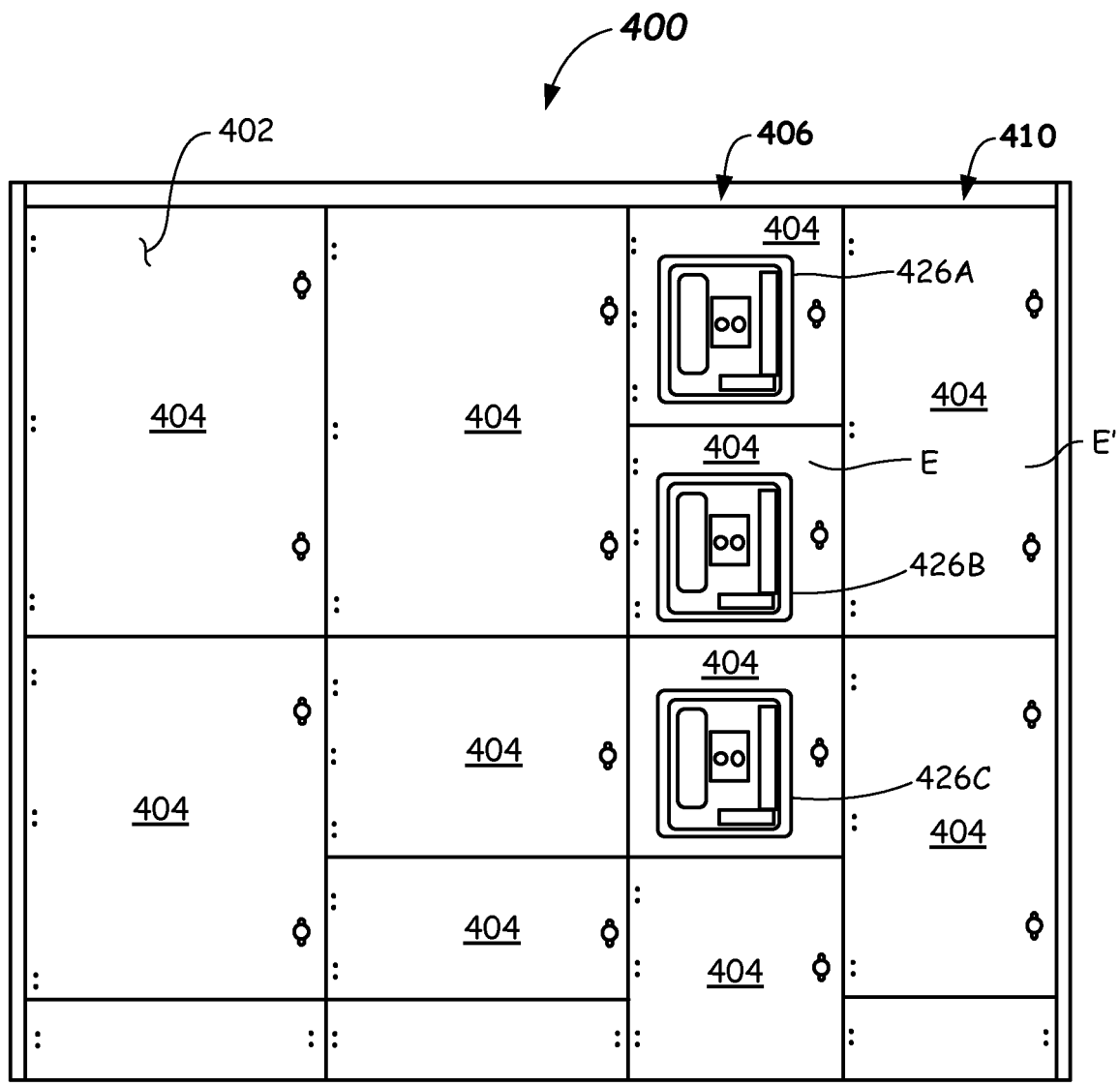
FIG. 4 illustrates a front plan view of a switchgear cabinet including one or more electrical bus bar assemblies and components thereof according to one or more embodiments.

FIG. 4 illustrates the environment in which the various embodiments of the disclosure reside. A front elevation view of an exterior of an electrical power distribution enclosure 400 is shown according to one or more embodiments. The electrical power distribution enclosure 400 may include a front surface 402 including a plurality of panels 404 (a few labeled). A first plurality of the panels 406 (e.g., a column of panels 404) may include user interfaces, which may include control elements, such as switches and/or circuit breakers and other controllers and/or monitors to control and possibly monitor power distribution to different loads at different locations. As depicted in FIG. 4, the user interface zone of panels 406 includes three user interfaces, referred to individually as a first user interface 426A, a second user interface 426B, and a third user interface 426C. In the embodiment depicted in FIG. 4, the first plurality of panels 406 of the may be vertically aligned.

A second plurality of panels 410 may contain behind them portions of run-over bus bars and portions of horizontal bus bars and terminal blocks, for example. The other portions of the run-over bus bars and horizontal bus bars can be present behind the first plurality of panels 406. The horizontal bus bars can interconnect to line power, for example. Terminal blocks and the like that can electrically connect to electrical loads via cables and allow power to be distributed thereto can be connected to the run-over bus bars behind the second plurality of panels 410. The second plurality of panels 410 and components behind them are collectively referred to as the terminal and bus section. In the embodiment depicted in FIG. 4, the second plurality of panels 410 of the terminal and bus section may be vertically aligned. The first plurality of panels 406 may be adjacent or abut the second plurality of panels 410.

Reference is made to a panel 404 labeled E in the user interface zone and to panel 404 labeled E' in the adjacent terminal and bus section, which may be representative of other panels in their respective sections. The panel E' may be opened or removed to enable a user to have access within the terminal and bus section. Terminal block assemblies (not shown in FIG. 4) located behind the panel E' may be electrically connected to cables that provide power to locations and electrical loads as described above. Similarly, run-over bus bars, such as A-phase, B-phase, and C-phase run-over bus bars as well as horizontal bus bars can be located behind the panel E'. The panel E may include a user interface 426B, and can include components such as controls, monitors, switches, and circuit breakers that control and monitor the power distributed via the terminal assemblies located behind the panel E'. Run-over bus bars connect between the circuit breakers and the terminal blocks, for example.

Now referring to FIG. 1A-1F, an embodiment of an electrical bus bar assembly 100 is shown. The electrical bus bar assembly 100 can comprise a first run-over bus bar 104 that runs over (e.g., horizontally) from the base 109 to a connection to a terminal block. Further, the electrical bus bar assembly 100 can comprise a second run-over bus bar 106 spaced a first distance D1 from the first run-over bus bar 104. Spacing D1 can be based on the overall rigidity of the systems and the number and types of bus bar supports. First distance D1 can be between 13 cm and 17 cm, for the 150 Ka system shown, for example. Other suitable values can be used. Less spacing can be used for lower Ka ratings. Additionally, the electrical bus bar assembly 100 can comprise a first horizontal bus bar 105 spaced a distance D2 from the first run-over bus bar 104. Additionally, a third run-over bus bar 111 can run over from the base 109, and can be parallel to the first run-over bus bar 104 and the second run-over bus bar 106.

Each of the run-over bus bars 104, 106, 111 can be formed of a laminated metal bar construction including multiple layers of a highly conductive-conductive material, such as copper or silver-coated copper. Each of the run-over bus bars 104, 106, 111 may include a bend therein (e.g., a right angle bend), such that they may start at hardware 113 near the base 109, run horizontally in parallel to one another and end near the terminal blocks (not shown). The electrical bus bar assembly 100 can also comprise one or more yoke brace apparatus 108 coupled between the first run-over bus bar 104 and the second run-over bus bar 106. The yoke brace apparatus 108 can be provided to maintain the first distance D1 between the first run-over bus bar 104 and the second run-over bus bar 106. Yoke brace apparatus 108 and first and second run-over bus bars 104, 106 can run along proximate to a back portion of the cabinet 400, for example. The electrical bus bar assembly 100 can further comprise one or more bus bar brace apparatus 110 provided to maintain a second distance D2 (FIG. 1D) between the first run-over bus bar 104 and the first horizontal bus bar 105. In particular, the first run-over bus bar 104 can carry A-phase current, the second run-over bus bar 106 can carry B-phase current, and the third run-over bus bar 111 can carry C-phase current.

The run-over bus bars 104, 106, 111 can include hardware 113 adjacent to the base 109 that are configured to attach to A-, B-, and C-phase stabs of a circuit breaker (not shown). The first horizontal bus bar 105, a second horizontal bus bar 115, and the third horizontal bus bar 120 can run over within the electrical power distribution enclosure 400, such as across a back portion of the cabinet 400, and connect line power to line side terminals of the circuit breakers and could also attach to one or more vertical electrical bus bars which also can carry A-, B-, and C-phase line power. The base 109 can attach to frame supports of the electrical power distribution enclosure 400, such as mid-frame supports (not shown), for example.

Figure 1C:
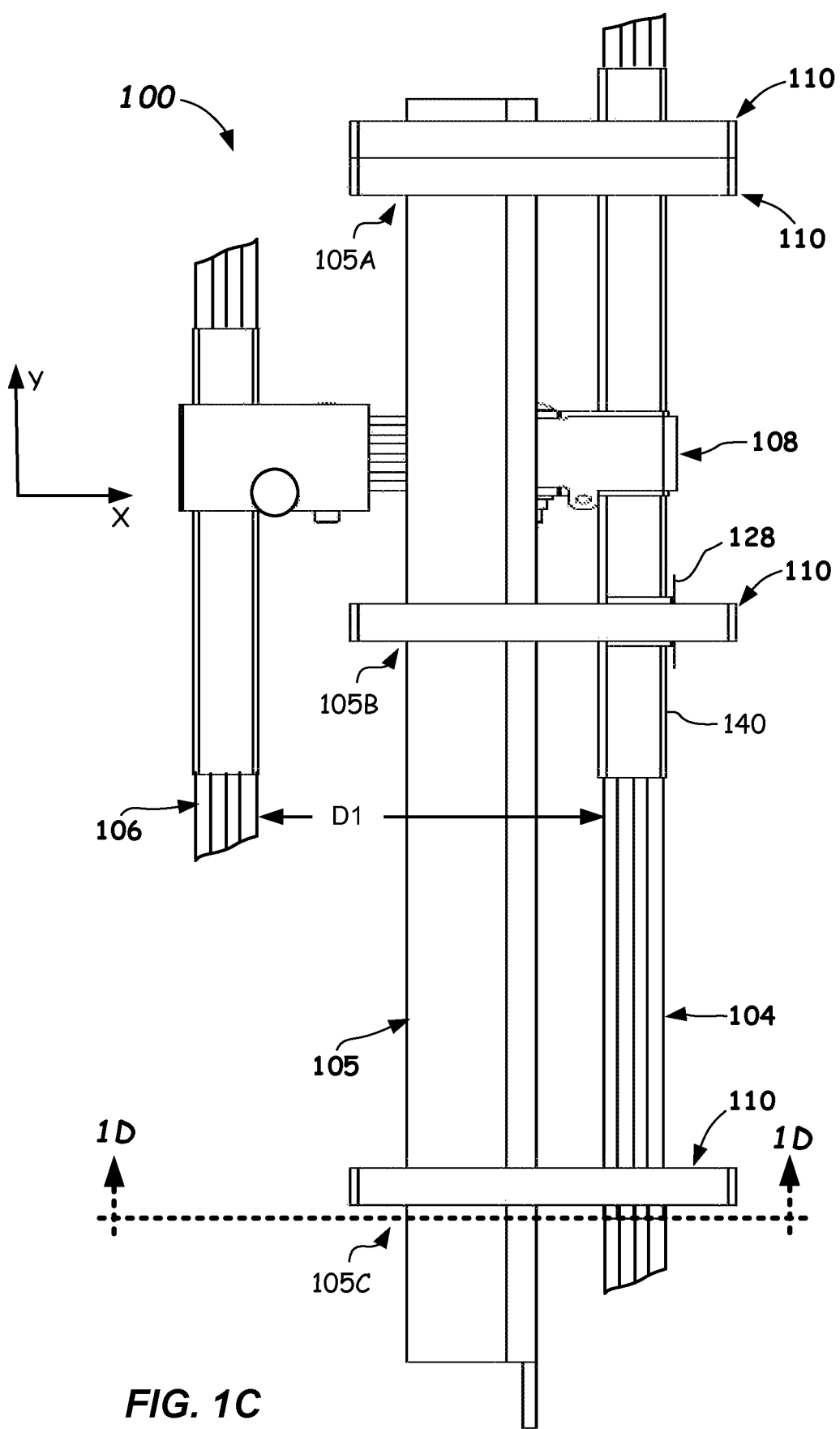
FIG. 1C illustrates a partial top plan view of an electrical bus bar assembly according to embodiments.
Figure 1G:
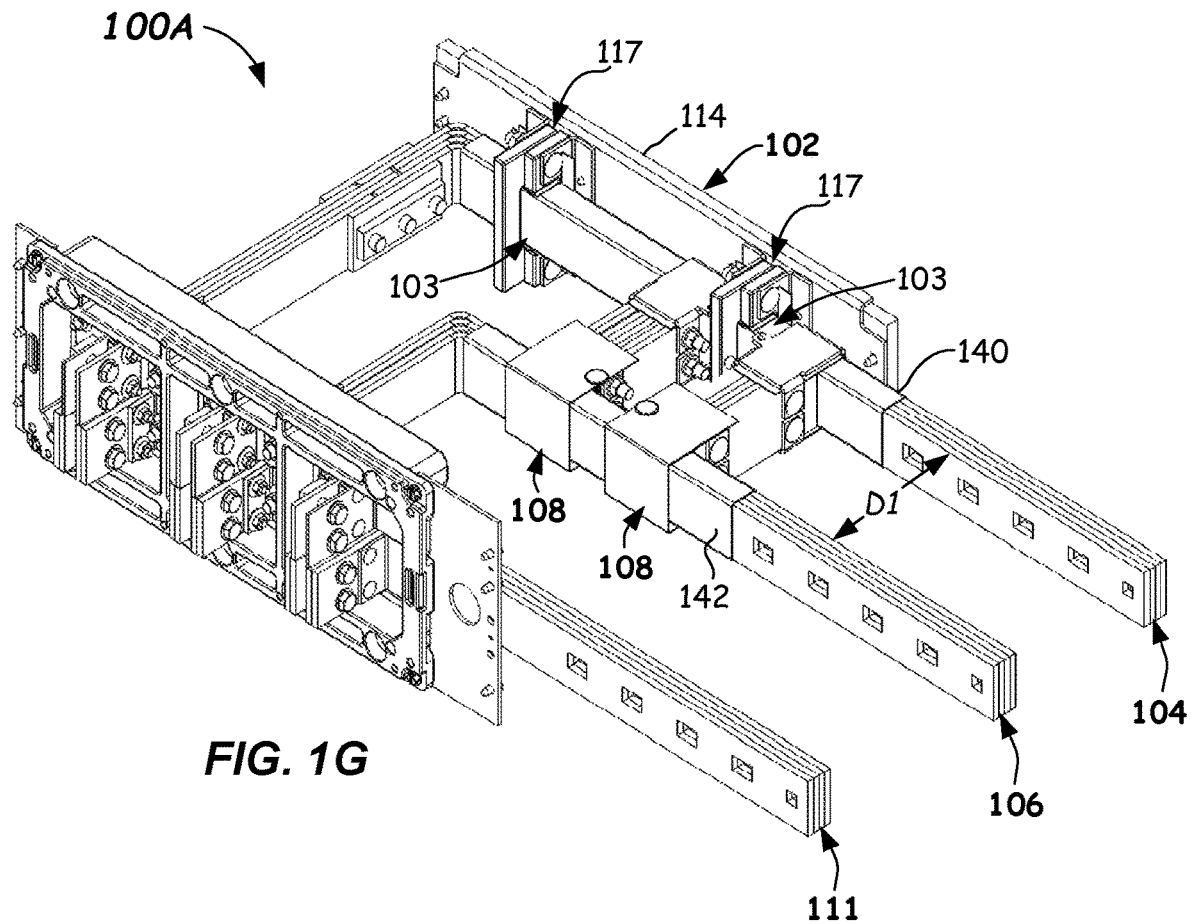
FIG. 1G illustrates a front perspective view of a supported electrical bus bar assembly according to embodiments.
Figure 1H:
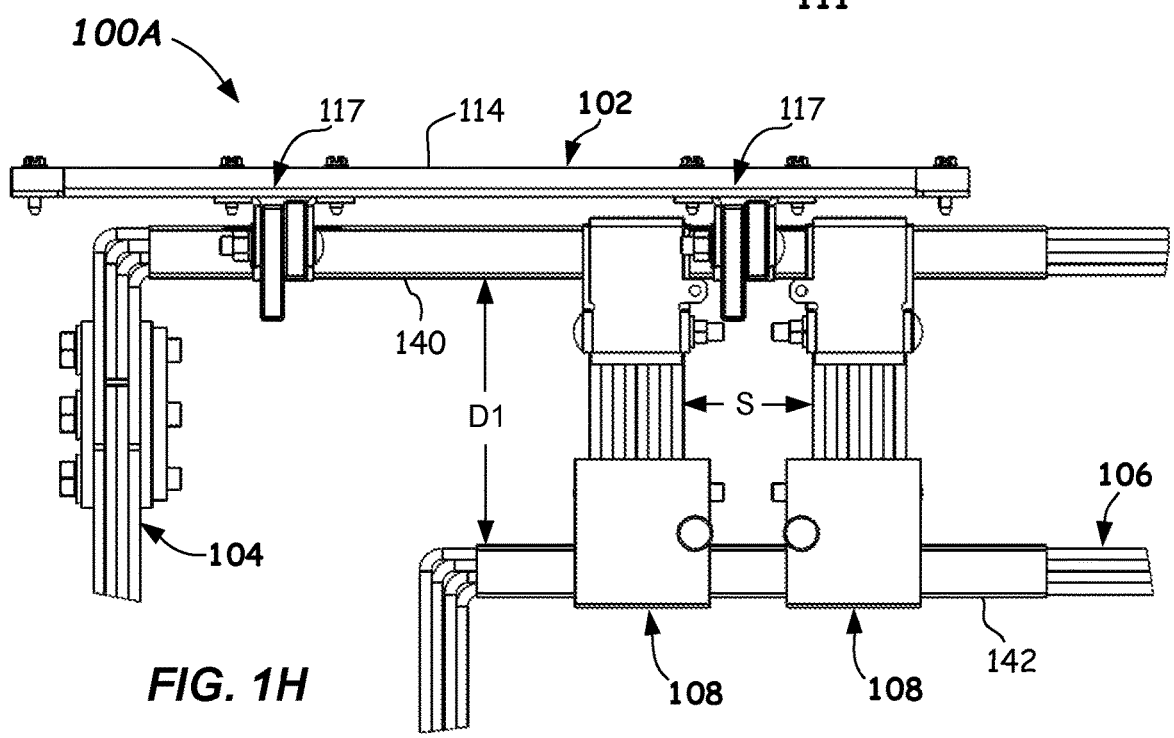
FIG. 1H illustrates a top plan view of a supported electrical bus bar assembly according to embodiments.

Shown in FIGS. 1G and 1H is another embodiment of the bus bar assembly 100A including a bus bar support assembly 102. The bus bar support assembly 102 can be configured to support the first run-over bus bar 104, as is shown. This configuration of the bus bar support assembly 102 can be used to support any electrical bus bar. The bus bar support assembly 102 will be further described with reference to FIGS. 3A-3C later herein, but broadly, the bus bar support assembly 102 includes a support structure 114 configured to couple to a structural component (e.g., a frame—not shown) of a electrical power distribution enclosure 400 and one or more insulating support assemblies 117 each including a bus bar-receiving opening 103 therein that is configured to fully encircle the first run-over bus bar 104.

In more detail, in the electrical bus bar assembly 100A, one or more yoke brace apparatus 108 can be coupled between the first run-over bus bar 104 and the second run-over bus bar 106. One yoke brace apparatus 108 is shown in the embodiment of FIG. 1A-1F, whereas two yoke brace apparatus 108 are shown spaced by a spacing S to one another along the length of the first run-over bus bar 104 in the embodiment of FIGS. 1G and 1H. The spacing S can be between about 10 cm and about 15 cm apart, for example. However, other spacing S can be used.

In the depicted embodiment of FIGS. 1G-1H, two yoke brace apparatus 108 are shown. However, it should be recognized that in some embodiments, less than two, or even more than two yoke brace apparatus 108 may be used to adequately support and maintain a fixed spacing relationship of the second run-over bus bar 106 relative to the first run-over bus bar 104.

In the depicted embodiment of FIGS. 1G-1H, the portions of the second run-over bus bar 106 that are supported by the one or more yoke brace apparatus 108 can extend in parallel to supported portions of the first run-over bus bar 104. The one or more yoke brace apparatus 108 are coupled to the first run-over bus bar 104 and the second run-over bus bar 106 and are configured to maintain the fixed spacing distance D1 (FIG. 1H). The yoke brace apparatus 108 can also aid in retaining parallelism between the first and second run-over bus bars 104, 106 and can provide relative support there between.

In more detail, one of the yoke brace apparatus 108 and its bus bar attachment structures will be described with reference to FIGS. 2A and 2B herein. If multiple yoke brace apparatus 108 are used, each yoke brace apparatus 108 can be identical or substantially identical to one another and provided in a spaced apart relationship (e.g., spacing S—FIG. 1H). The yoke brace apparatus 108 comprises a yoke brace spacer 210 including a first end 212A and a second end 212B. The yoke brace spacer 210 can include laminated construction, i.e., having multiple insulating laminates stacked in a side-by-side orientation with one another. Each of the laminates can be made of an insulating material, but can be of different types of insulators. Each of the laminates can be rectangular in shape as best shown in FIG. 2B, and can, by way of example, have a length L of between about 13.6 cm and 14.8 cm, a width (W in the vertical dimension) of between about 3.8 cm and 6.4 cm, and a thickness T of between about 5 mm and 8 mm, for example. Other dimensions can be used.

The laminated construction of the yoke brace spacer 210 can comprise laminates that are structural laminate components 210A having a first rigidity and spacer laminate components 210B having a second rigidity that is less than the first rigidity. For example, for the 150 kA electrical bus bar assemblies 100, 100A shown, the outermost two laminates on each respective horizontal side of the yoke brace spacer 210 can be structural laminate components 210A and the innermost four laminates can be spacer laminate components 210B. Structural laminate components 210A and spacer laminate components 210B can be of the same or different lengths.

For example, each of the structural laminate components 210A can be manufactured from a rigid insulating material, such as a glass fiber epoxy laminate. One suitable rigid insulating material is FR-4. FR-4 is a composite material composed of woven fiberglass cloth with an epoxy resin binder that is flame resistant (self-extinguishing). FR-4 epoxy resin systems can employ bromine, a halogen, to facilitate flame-resistant properties. FR-4 glass epoxy laminates can have a flexural strength (A, 0.125) of greater than 415 Mpa (600,200 psi) lengthwise, and thus are quite rigid. Other suitably rigid structural insulating materials can be used for the structural laminate components 210A.

The spacer laminate components 210B can be made of a GP03 fiberglass NEMA sheet that can encompass random mat glass material that is impregnated with a thermoset polyester resin, for example. Other suitable materials may be used for the spacer laminate components 210B. The primary function of the spacer laminate components 210B is to space apart the structural laminate components 210A, but not to carry any appreciable tensile or compressive load. In the depicted embodiment, two structural laminate components 210A per side are shown, and four spacer laminate components 210B are used in the center. However, it should be recognized that other numbers and dimensions of the structural laminate components 210A and spacer laminate components 210B could be used to achieve the desired stiffness and overall dimensions. With 8 total laminates, the width of the yoke brace spacer 210 can be about 51 mm, for example. Other widths can be used.

Figure 2A:
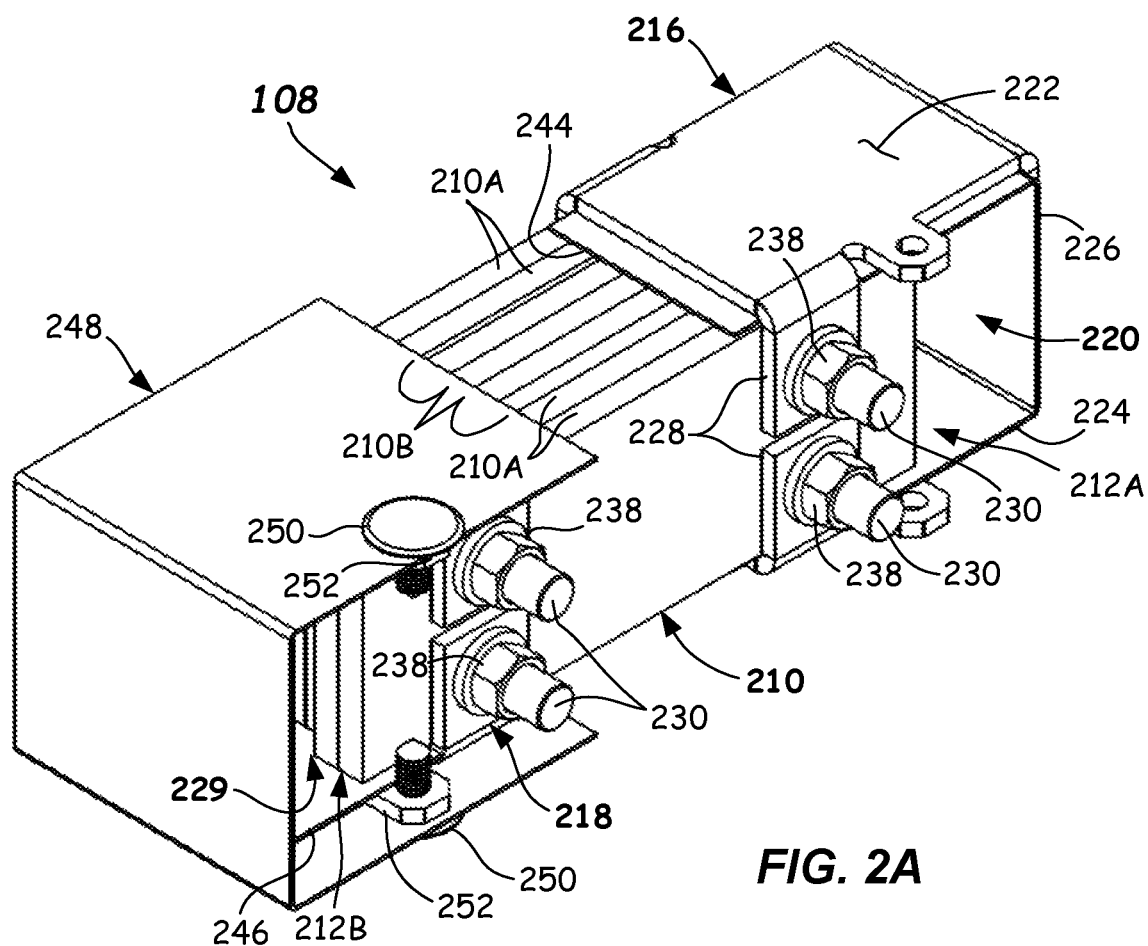
FIG. 2A illustrates a perspective view of a yoke brace apparatus according to one or more embodiments.
Figure 2B:
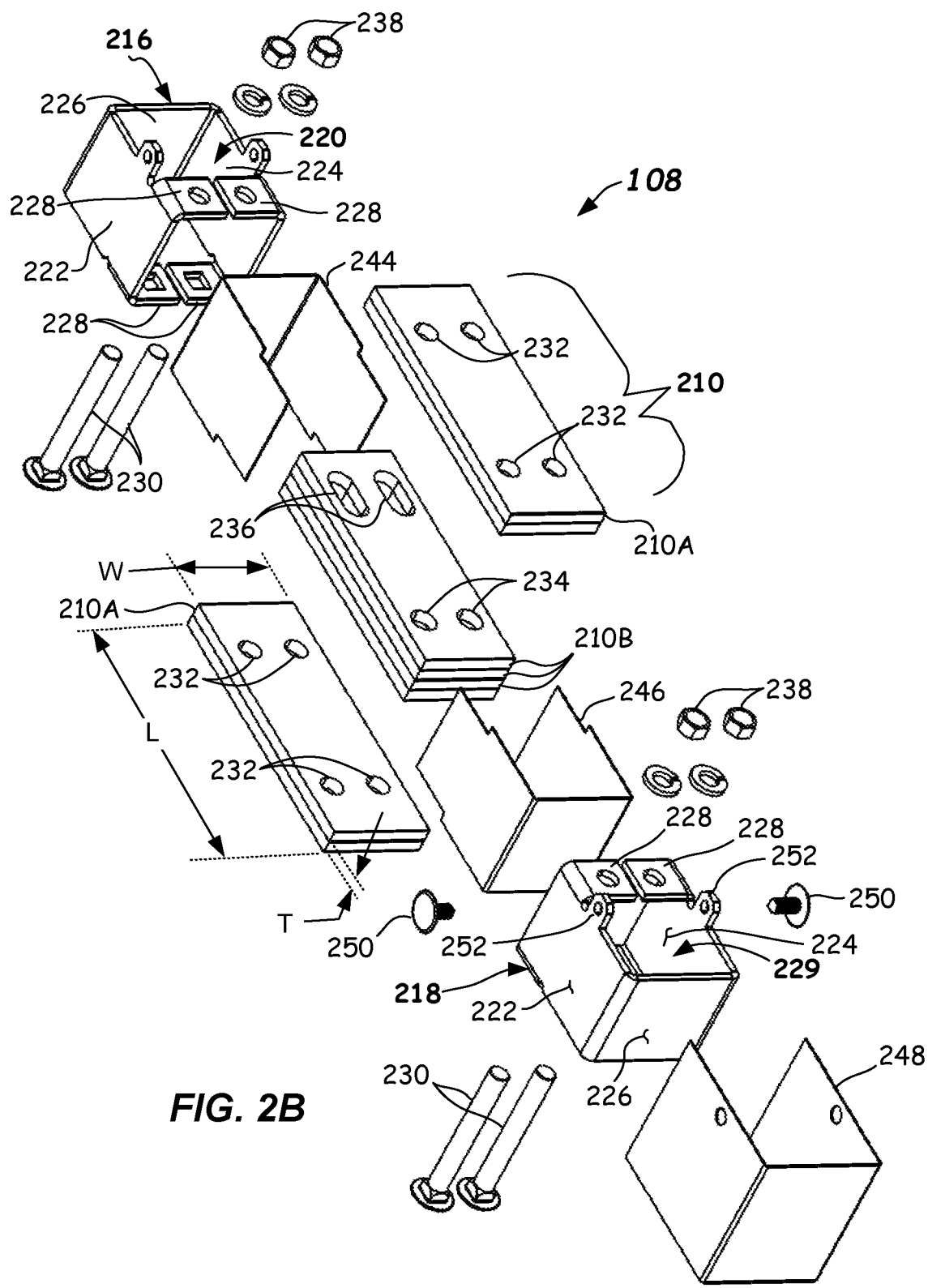
FIG. 2B illustrates an exploded perspective view of a yoke brace apparatus according to one or more embodiments.

The yoke brace apparatus 108, as best shown in FIGS. 2A and 2B, further includes a first yoke bracket 216 that is coupled to the yoke brace spacer 210 on the first end 212A, and a second yoke bracket 218 coupled to the yoke brace spacer 210 on the second end 212B opposite from the first end 212A. The first yoke bracket 216 can include a first channel 220 there through. The first channel 220 can be formed by structural features of the first yoke bracket 216, such as top wall 222, bottom wall 224, and end wall 226, and fastener tabs 228 or the end of the yoke brace spacer 210.

The second yoke bracket 218 can be identical or similar to the first yoke bracket 216, and can include a second channel 229 passing there through. The second channel 229 can be formed by structural features of the second yoke bracket 218, such as top wall 222, bottom wall 224, and end wall 226, and fastener tabs 228 or the end of the yoke brace spacer 210. The yoke brace apparatus 108 is assembled by attaching the first yoke bracket 216 and the second yoke bracket 218 to the yoke brace spacer 210. The attachment can be by fasteners, such as by inserting first fasteners 230 (e.g., square head bolts or the like) through holes formed in the fastener tabs 228, and passing through apertures 232, 234 and slots 236 formed in the yoke brace spacer 210, and securing by second fasteners 238 (e.g., nuts or the like). The slots 236 formed in the end of the yoke brace spacer 210 allow for some length adjustment. In particular, an adjustment of length can be provided so that the yoke brace spacer 210 can adjust to variations in the spacing distance D1 between the first run-over bus bar 104 and the second run-over bus bar 106. Further, various embodiments can include different lengths L of the yoke brace spacer 210 to meet the needs of the run-over bus bar installation configuration.

As shown in FIGS. 1C, 1G, and 1H, the first end 212A of the yoke brace spacer 210 is coupled to the first run-over bus bar 104 by the first yoke bracket 216 and the second end 212B of the yoke brace spacer 210 is coupled to the second run-over bus bar 106 by the second yoke bracket 218. The first yoke bracket 216 including the first channel 220 is configured to couple to the first run-over bus bar 104. The second yoke bracket 218 is coupled to the yoke brace spacer 210 on the second end 212B opposite from the first end 212A. The second yoke bracket 218 includes a second channel 229 that is configured to couple to the second run-over bus bar 106. In particular, the first channel 220 of the first yoke bracket 216 and the second channel 229 of the second yoke bracket 218 are slid over the first and second run-over bus bars 104, 106, and then second fasteners 238 may be tightened. Once secured, the yoke brace apparatus 108 is configured to maintain a fixed axial spacing distance between the first channel 220 and the second channel 229, and thus a fixed spacing distance D1 between the first run-over bus bar 104 and the second run-over bus bar 106. Additional insulating barriers, such as insulating sheets, may be placed on top of the yoke brace apparatus 108 to provide further protection from arcing between close-by bus bars, such as horizontal bus bars (e.g., first horizontal bus bar 105).

In some embodiments, a first insulation sheathing 140 can be provided to wrap about a portion of the first run-over bus bar 104 passing through the first channel 220 of the first yoke bracket 216. Likewise, in some embodiments, a second insulation sheathing 142 can be provided so that the second insulation sheathing 142 is wrapping about a portion of the second run-over bus bar 106 passing through the second channel 229 if the second yoke bracket 218. The first insulation sheathing 140 and the second insulation sheathing 142 can be any suitable insulating sheathing that wraps around the respective run-over bus bars 104, 106, such as a shrink fit sleeve, a molded tube, a wrap of insulation, or the like of a suitable insulating material, such as polypropylene, polyphenylene ether and polystyrene blend, polyvinylchloride (PVC), vinyl, or polyolefin, and the like. Such first insulation sheathing 140 and the second insulation sheathing 142 can be provided to meet UL requirements, flammability, and resistance to electrical path tracking.

Again referring to FIGS. 2A and 2B, in some embodiments, a first inner insulating barrier 244 can be received within (inside of) the first yoke bracket 216. The first inner insulating barrier 244 can comprise a U-shaped configuration that partially surrounds the first run-over bus bar 104. In particular, the first inner insulating barrier 244 can extend slightly wider than the first yoke bracket 216 in the area of the first channel 220. Similarly, a second inner insulating barrier 246 can be received within (inside of) the second yoke bracket 218. The second inner insulating barrier 246 can comprise a U-shaped configuration that partially surrounds the second run-over bus bar 106 and can extend slightly wider than the second yoke bracket 218 in the area of the second channel 229. The first inner insulating barrier 244 and the second inner insulating barrier 246 can be made of any suitable insulating material, such as polypropylene or polyphenylene ether and polystyrene blend, sheet material, and cut and bent to shape.

In order to provide insulation around the second yoke bracket 218 an outer insulating barrier 248 can be received over the second yoke bracket 218. The outer insulating barrier 248 can comprise a U-shaped configuration that partially surrounds the second yoke bracket 218 and the supported portion of the second run-over bus bar 106. As shown in FIG. 2A, the outer insulating barrier 248 can extend slightly wider than the second yoke bracket 218 in the area of the second channel 229. In particular, the outer insulating barrier 248 can extend as wide as or slightly wider than the ends of the first fasteners 230. The outer insulating barrier 248 can be secured to the second yoke bracket 218 by push pins 250 inserted through holes in the outer insulating barrier 248 and into tangs 252 formed on the second yoke bracket 218. Other suitable means for attaching the outer insulating barrier 248 can be used.

FIGS. 1D through 1F illustrate an embodiment of a bus bar brace apparatus 110 in accordance with another embodiment of the disclosure capable of broad usage. The bus bar brace apparatus 110 comprises a body 125 of an insulating material wherein the body 125 may include planar front and back surfaces, a first opening 126 through the body 125 configured to receive at least a portion of a first horizontal bus bar 105 (e.g., a half portion), and a second opening 127 through the body 125 configured to receive the first run-over bus bar 104. The insulating material can be a plastic material, such as FR-4, glass fiber epoxy laminate, for example, and may be molded or machined. The first opening 126 and the second opening 127 are configured and positioned to maintain a desired second spacing distance D2 between the first run-over bus bar 104 and the first horizontal bus bar 105. The second spacing distance D2 can be between 3 cm and 6 cm for the 150 Ka system shown, for example. Other spacing values could be used. The first opening 126 and the second opening 127 of the bus bar brace apparatus 110 can have a rectangular shape in transverse cross section in a long plane of the body 125. The shapes can closely match a cross-sectional shape of the respective first run-over bus bar 104 and first horizontal bus bar 105 or portions thereof. For example, the first opening 126 can receive only a partial portion of the first horizontal bus bar 105, such as a half portion thereof.

In some embodiments, a center of the first opening 126 and a center of the second opening 127, as shown in FIG. 1E can be offset from one another. For example, the center of the first opening 126 and the center of the second opening 127 can be offset from one another in an X direction (OFX). Furthermore, a center of the first opening 126 and a center of the second opening 127 can be offset from one another in a Z direction (OFZ).

In some embodiments, an insulating spacer 128 (FIG. 1C) configured to be received inside of the second opening 127 wherein the insulating spacer 128 can provide an addition layer of insulation, such as on three sides of the second opening 127. This insulating spacer 128 can provide an extra layer of electrical insulation over and above that provided by the insulating sheathing 140 and can further help restrain an axial position of the bus bar brace apparatus 110 along the first run-over bus bar 104. The insulating sheathing 140 can wrap about a portion of the first run-over bus bar 104, and the insulating sheathing 140 can pass through the second opening 127 through the body 125. The insulating spacer 128 can at least partially surround the insulating sheathing 140. For example, the insulating spacer 128 can provide a layer of insulation above, below, and on one side of the first run-over bus bar 104. Insulating spacer 128 may be a cut and bent sheet of a polypropylene sheet material or the like.

The bus bar brace apparatus 110 can further comprise a notch 129 configured to abut at least a portion of the second horizontal bus bar 115, such as a top thereof. The notch 129 can include a first side portion 129A than extends horizontally in the X direction and a second side portion 129B that extends vertically in the Z direction, for example.

Bus bar brace apparatus 110 can be positioned at various locations along the first run-over bus bar 104 and the first horizontal bus bars 105. For example, as shown in FIG. 1C, a first bus bar brace apparatus 110 can be provided at a first location 105A along the first horizontal bus bar 105, a second bus bar brace apparatus 110 at a second location 105B along the first horizontal bus bar 105, and a third bus bar brace apparatus 110 at a third location 105C along the first horizontal bus bar 105. In some embodiment, a first bus bar brace apparatus 110 at a first location 105A along the first horizontal bus bar 105 can be located on a first side of the yoke brace apparatus 108, and a second bus bar brace apparatus 110 at a second location 105B along the first horizontal bus bar 105 can be located on a second side of the yoke brace apparatus 108. Other arrangements of the bus bar brace apparatus 110, including doubling up two or more of the bus bar brace apparatus 110 where additional support is desired can be used. Spacing between respective (non-doubled up) bus bar brace apparatus 110 can be between 28 cm and 36 cm, for example. Other spacing options are possible.

As should be apparent then, in some embodiments, an electrical bus bar assembly 100 comprises a first run-over bus bar 104, a first horizontal bus bar 105 spaced apart from the first run-over bus bar 104, such as by a spacing distance D2, and one or more bus bar brace apparatus 110 provided to maintain the distance D2 between the first run-over bus bar 104 and the first horizontal bus bar 105. As discussed above, the bus bar brace apparatus 110 comprises the body 125 of insulating material, the first opening 126 through the body 125 receiving at least a portion of the first horizontal bus bar 105 there through, and the second opening 127 through the body 125 receiving the first run-over bus bar 104 there through.

In another broad embodiment capable of independent usage with other electrical bus bar structures, an embodiment of the bus bar support assembly 102 is provided as best shown in FIGS. 3A-3C. The bus bar support assembly 102 provides support for an electrical bus bar (e.g., first run-over bus bar 104) along a length thereof, for example. The bus bar support assembly 102 comprises a support structure 114 that is configured to couple to a structural component 362 of an electrical power distribution enclosure 400, such as between cabinet frame uprights (e.g., rear cabinet frame uprights shown dotted) thereof. The support structure 114 can be coupled to the structural component 362 such as cabinet frame uprights by screws 365 or the like. Support structure 114 may be a sheet metal component and may include bends along a length thereof to enhance structural rigidity.

The bus bar support assembly 102 further comprises a first mounting bracket 364 including a first attachment portion 366 coupled to the support structure 114, and a second mounting bracket 367 including a second attachment portion 369 coupled to the support structure 114. The bus bar support assembly 102 further comprises an insulating support assembly 372 including a bus bar-receiving opening 103 configured to fully encircle the electrical bus bar (e.g., run-over bus bar 104). In the depicted embodiment, two spaced-apart insulating support assemblies 372 each including a bus bar-receiving opening 103 are provided.

In some embodiments, the bus bar support assembly 102 can comprise a reinforcement plate 373 coupled to the support structure 114. Reinforcement plate 373 operates to make the support structure 114 more rigid. Reinforcement plate 373 may be made of a rigid metal material, such as FR-4, glass fiber epoxy laminate and may be about 40 cm to 60 cm long, 8 cm to 16 cm wide, and 0.8 cm to 1.2 cm thick, for example. Other dimensions can be used.

The bus bar support assembly 102 further includes mounting brackets 364, 367 each including a respective attachment portions 366, 369 that are configured to couple to the support structure 114, such as by bolts 371 and the like. The bolts 371 may pass through aligned holes in the reinforcement plate 373 and the support structure 114 and into holes in the attachment portions 366, 369, which may be threaded or the attachment portions 366, 369 can be otherwise be secured by nuts (not shown). The attachment portions 366, 369 can be rectangular in shape and can be planar. A first tab 368 and a second tab 370 can each extend from the attachment portions 366, 369, such as 90 degrees therefrom. The first tab 368 and a second tab 370 can each extend from an end of the attachment portions 366, 369 such as the lower and upper ends thereof as shown in FIG. 3A.

An insulating support assembly 372 is coupled between each of the mounting brackets 364, 367. The insulating support assembly 372 comprises a first insulating support 376 and a second insulating support 377, the first insulating support 376 abutting the second insulating support 377 and forming the bus bar-receiving opening 103. As shown, each insulating support assembly 372 is coupled between the first tabs 368 and the second tabs 370 of the respective mounting brackets 364, 367, such as by lateral fasteners 374 and nuts 375. The lateral fasteners 374 can be carriage-type fasteners, for example (e.g., ⅜"-16 carriage bolts). The insulating supports 376, 377 can each be configured to include a side bus bar support portion 378, a first bus bar end support 379, and a second bus bar end support 380 extending from the side bus bar support portion 378 and forming the bus bar-receiving opening 103 that has a closed perimeter configured to entirely encircle an electrical bus bar (e.g., the first run-over bus bar 104).

The insulating support assemblies 372 thus each include the bus bar-receiving opening 103 that are configured as closed loops therefore allowing an electrical bus bar (e.g., the first run-over bus bar 104) to be received therein. Each of the insulating supports 376, 377 can include a C-shape as shown and can be made of a suitable insulation material, such as FR-4 described above, for example. The first insulating support 376 and a second insulating support 377 comprise opposed openings (e.g., side openings) that interface to form the bus bar-receiving opening 103. Other cooperative arrangements to form a closed opening to encircle the electrical bus bar are possible.

In the depicted embodiment, two insulating support assemblies 372 and respective mounting brackets 364, 367 are shown in a spaced apart orientation. The support structure 114 and the reinforcement plate 373 can include a series of holes therein that can allow for the spacing between the respective assemblies of insulating support assemblies 372 to be adjusted to provide improved support for different applications. Spacing may be adjusted between about 20 cm and 30 cm, for example. Other suitable spacing is possible. Four columns of holes for adjustment of the location of the insulating support assemblies 372 are shown and allow for spacing adjustment capability. Other numbers of holes are possible.

Figure 5:
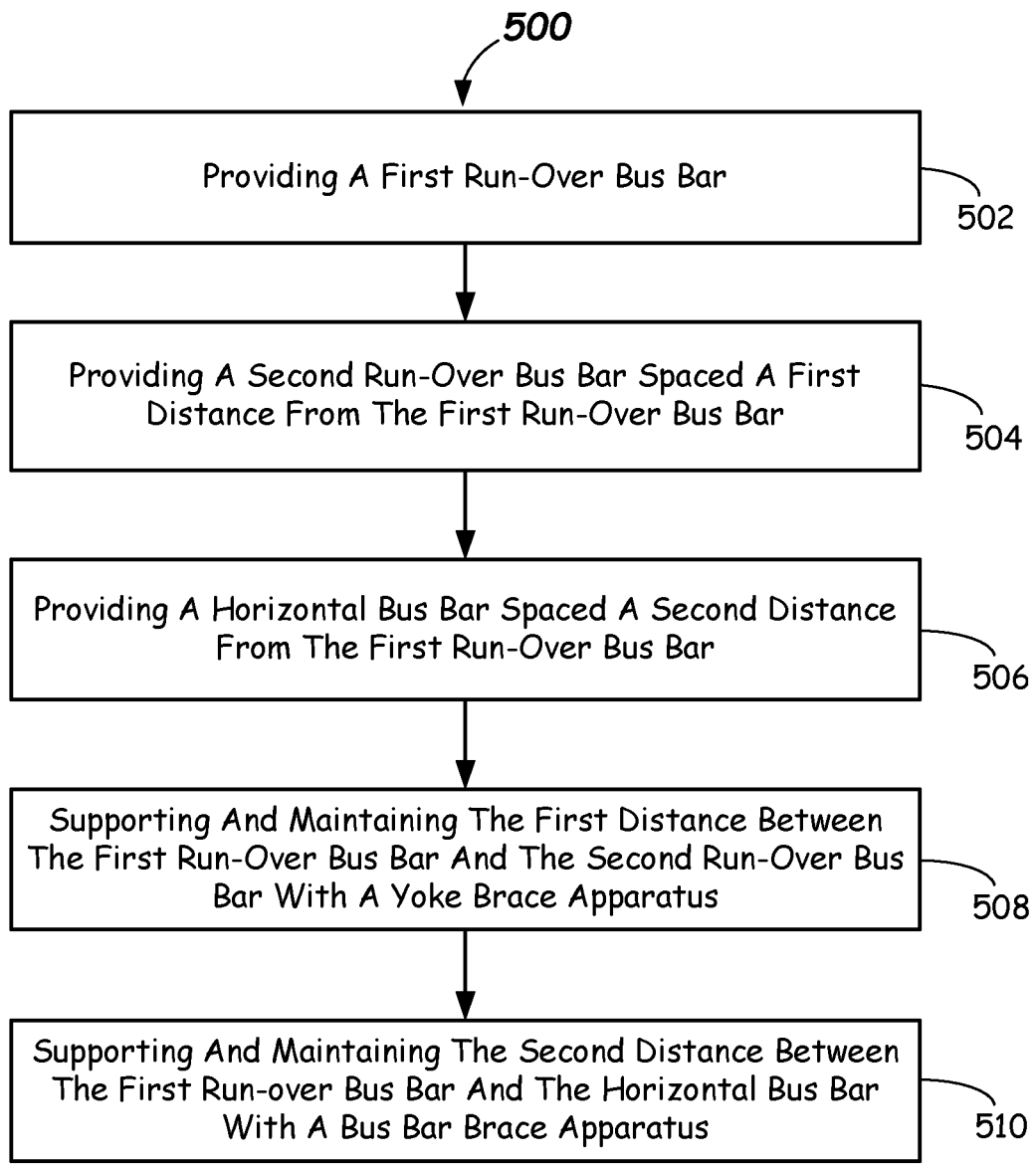
FIG. 5 illustrates a flowchart of a method of supporting electrical bus bars according to embodiments.

FIG. 5 illustrates a first method of supporting electrical bus bars using the electrical bus bar assembly 100 of FIGS. 1A-1F. The method 500, involves, in 502, providing a first run-over bus bar (e.g., first run-over bus bar 104), and, in

504, providing a second run-over bus bar (e.g., second run-over bus bar 106) spaced a first distance (e.g., first distance D1) from the first run-over bus bar, and, in 506, providing a horizontal bus bar (e.g., first horizontal bus bar 105) spaced a second distance (e.g., second distance D2) from the first run-over bus bar.

The method 500 further includes, in 508, supporting and maintaining the first distance D1 between the first run-over bus bar and the second run-over bus bar with a yoke brace apparatus (e.g., yoke brace apparatus 108), and, in 510, supporting and maintaining the second distance D2 between the first run-over bus bar and the horizontal bus bar with a bus bar brace apparatus (e.g. bus bar brace apparatus 110).

Figure 6:
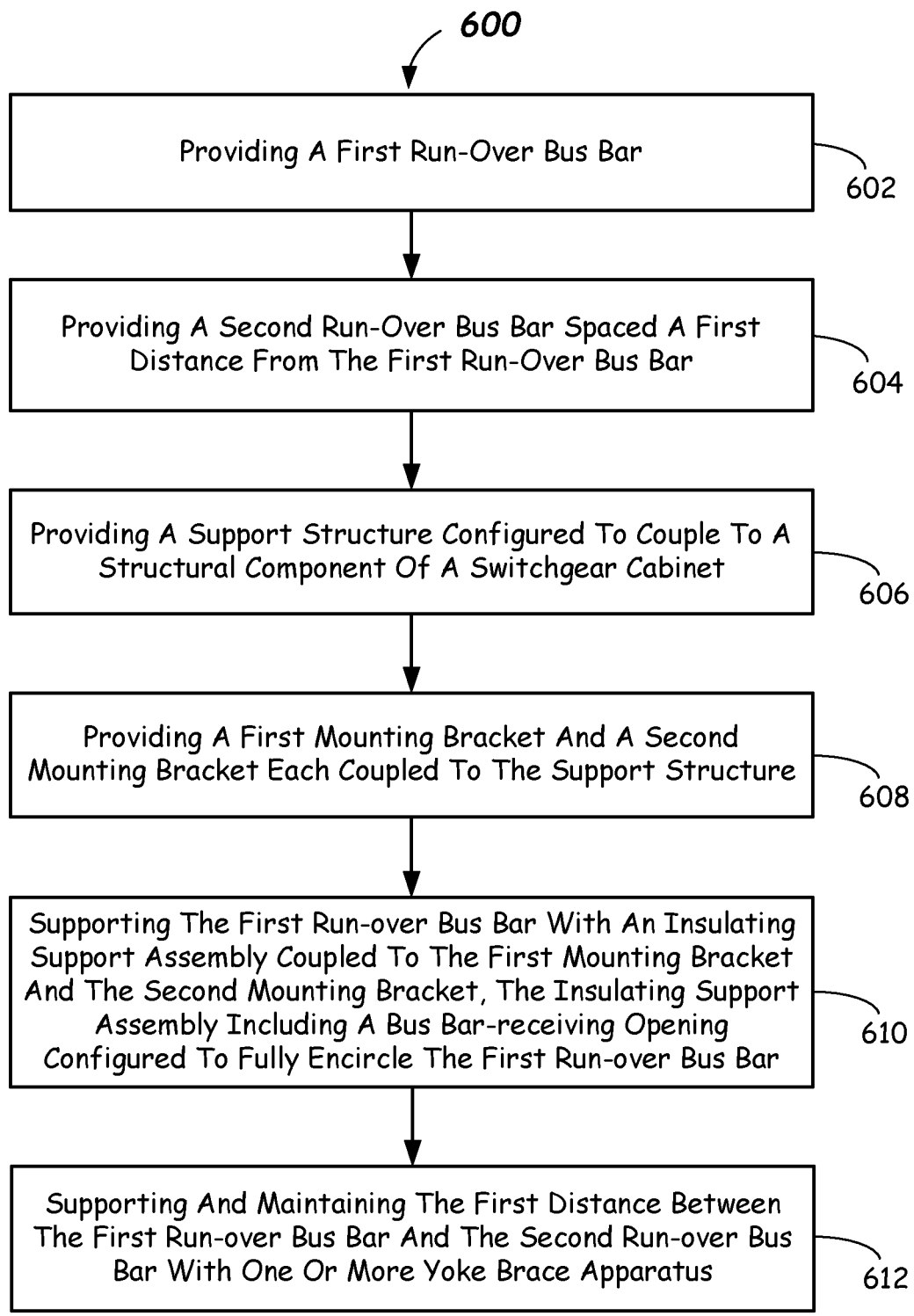
FIG. 6 illustrates a flowchart of another method of supporting electrical bus bars according to embodiments.

FIG. 6 illustrates a second method of supporting electrical bus bars using the electrical bus bar assembly 100A of FIGS. 1G-1H. The method 600, comprises, in 602, providing a first run-over bus bar (e.g., first run-over bus bar 104), and, in 604, providing a second run-over bus bar (e.g., second run-over bus bar 106) spaced a first distance (e.g., first distance D1) from the first run-over bus bar.

The method 600, further comprises, in 606, providing a support structure (e.g., support structure 114) configured to couple to a structural component (e.g., structural component 362 such as frame upright or the like) of a switchgear cabinet (e.g., electrical power distribution enclosure 400).

The method 600 further comprises, in 608, providing a first mounting bracket (e.g., first mounting bracket 364) and a second mounting bracket (e.g., second mounting bracket 367) each coupled to the support structure (e.g., support structure 114).

The method 600, further comprises, in 610, supporting the first run-over bus bar with an insulating support assembly (e.g., insulating support assembly 372) coupled to the first mounting bracket and the second mounting bracket, the insulating support assembly including a bus bar-receiving opening (e.g., bus bar-receiving opening 103) configured to fully encircle the first run-over bus bar.

Additionally, the method 600, further comprises, in 612, supporting and maintaining the first distance D1 between the first run-over bus bar (e.g., first run-over bus bar 104) and the second run-over bus bar r (e.g., second run-over bus bar 106), with one or more yoke brace apparatus (e.g., yoke brace apparatus 108).

It should be readily appreciated by those persons of ordinary skill in the art that the present invention is susceptible of broad utility and application. Many embodiments of the present disclosure other than those herein described, as well as many variations, modifications, and equivalent arrangements, will be apparent from, or reasonably suggested by, the present disclosure. Accordingly, while the present invention has been described herein in detail in relation to specific embodiments, it is to be understood that this disclosure is only illustrative and presents examples merely for purposes of providing a full and enabling disclosure. This disclosure is not intended to limit the invention to the particular apparatus, assemblies, and/or methods disclosed, but, to the contrary, the intention is to cover all modifications, equivalents, and alternatives falling within the scope of the claims.

What is claimed is:

1. An electrical bus bar assembly, comprising:
    a first run-over bus bar;
    a second run-over bus bar spaced a first distance from the first run-over bus bar;
    a first horizontal bus bar spaced from the first run-over bus bar;
    a yoke brace apparatus coupled between the first run-over bus bar and the second run-over bus bar; and
    one or more bus bar brace apparatus provided to maintain a second distance between the first run-over bus bar and the first horizontal bus bar, wherein the yoke brace apparatus comprises:
    a yoke brace spacer including a first end and a second end, a first yoke bracket coupled to the yoke brace spacer on the first end, the first yoke bracket coupled to the first run-over bus bar, and a second yoke bracket coupled to the yoke brace spacer on the second end opposite from the first end, the second yoke bracket coupled to the second run-over bus bar.

2. The electrical bus bar assembly of claim 1, wherein the one or more bus bar brace apparatus comprises:
    a body of insulating material;
    a first opening through the body receiving at least a portion of the first horizontal bus bar; and
    a second opening through the body receiving the first run-over bus bar.

3. The electrical bus bar assembly of claim 2, comprising:
    an insulating sheathing wrapping about a portion of the first run-over bus bar, the insulating sheathing passing through the second opening through the body.

4. The electrical bus bar assembly of claim 2, comprising:
    an insulating spacer received inside of the second opening wherein the insulating spacer provides a layer of insulation above, below, and on one side of the first run-over bus bar.

5. The electrical bus bar assembly of claim 2, wherein a center of the first opening and a center of the second opening are offset from one another in an X direction.

6. The electrical bus bar assembly of claim 2, wherein a center of the first opening and a center of the second opening are offset from one another in a Z direction.

7. The electrical bus bar assembly of claim 2, wherein the body of insulating material comprises a notch configured to abut at least a portion of a second horizontal bus bar.

8. The electrical bus bar assembly of claim 2, wherein the first opening and the second opening have a rectangular shape in cross section.

9. The electrical bus bar assembly of claim 1, comprising a first bus bar brace apparatus at a first location along the first horizontal bus bar, a second bus bar brace apparatus at a second location along the first horizontal bus bar, and a third bus bar brace apparatus at a third location along the first horizontal bus bar.

10. The electrical bus bar assembly of claim 1, comprising a first bus bar brace apparatus at a first location along the first horizontal bus bar on a first side of the yoke brace apparatus, and a second bus bar brace apparatus at a second location along the first horizontal bus bar on a second side of the yoke brace apparatus.

11. A method of supporting electrical bus bars, comprising:
    providing a first run-over bus bar;
    providing a second run-over bus bar spaced a first distance from the first run-over bus bar;
    providing a horizontal bus bar spaced a second distance from the first run-over bus bar;
    supporting and maintaining the first distance between the first run-over bus bar and the second run-over bus bar with a yoke brace apparatus;
    supporting and maintaining the second distance between the first run-over bus bar and the horizontal bus bar with a bus bar brace apparatus; and supporting the first run-over bus bar to a structural component of a switchgear cabinet with a bus bar support assembly having an insulating support assembly including a bus bar-receiving opening fully encircling the first run-over bus bar.

12. An electrical bus bar assembly, comprising:
a first run-over bus bar;
a second run-over bus bar spaced a first distance from the first run-over bus bar;
a first horizontal bus bar spaced from the first run-over bus bar;
a yoke brace apparatus coupled between the first run-over bus bar and the second run-over bus bar; and
one or more bus bar brace apparatus provided to maintain a second distance between the first run-over bus bar and the first horizontal bus bar, wherein the one or more bus bar brace apparatus comprises:
a body of insulating material;
a first opening through the body receiving at least a portion of the first horizontal bus bar; and
a second opening through the body receiving the first run-over bus bar.

13. The electrical bus bar assembly of claim 12, comprising:
an insulating sheathing wrapping about a portion of the first run-over bus bar, the insulating sheathing passing through the second opening through the body.

14. The electrical bus bar assembly of claim 12, comprising:
an insulating spacer received inside of the second opening wherein the insulating spacer provides a layer of insulation above, below, and on one side of the first run-over bus bar.

15. The electrical bus bar assembly of claim 12, wherein a center of the first opening and a center of the second opening are offset from one another in an X direction.

16. The electrical bus bar assembly of claim 12, wherein a center of the first opening and a center of the second opening are offset from one another in a Z direction.

17. The electrical bus bar assembly of claim 12, wherein the body of insulating material comprises a notch configured to abut at least a portion of a second horizontal bus bar.

18. The electrical bus bar assembly of claim 12, wherein the first opening and the second opening have a rectangular shape in cross section.

19. An electrical bus bar assembly, comprising:
a first run-over bus bar;
a second run-over bus bar spaced a first distance from the first run-over bus bar;
a first horizontal bus bar spaced from the first run-over bus bar;
a yoke brace apparatus coupled between the first run-over bus bar and the second run-over bus bar;
one or more bus bar brace apparatus provided to maintain a second distance between the first run-over bus bar and the first horizontal bus bar; and
a first bus bar brace apparatus at a first location along the first horizontal bus bar, a second bus bar brace apparatus at a second location along the first horizontal bus bar, and a third bus bar brace apparatus at a third location along the first horizontal bus bar.

20. An electrical bus bar assembly, comprising:
a first run-over bus bar;
a second run-over bus bar spaced a first distance from the first run-over bus bar;
a first horizontal bus bar spaced from the first run-over bus bar;
a yoke brace apparatus coupled between the first run-over bus bar and the second run-over bus bar;
one or more bus bar brace apparatus provided to maintain a second distance between the first run-over bus bar and the first horizontal bus bar; and
a first bus bar brace apparatus at a first location along the first horizontal bus bar on a first side of the yoke brace apparatus, and a second bus bar brace apparatus at a second location along the first horizontal bus bar on a second side of the yoke brace apparatus.

* * * * *